US011776955B2

(12) United States Patent
Nagata

(10) Patent No.: US 11,776,955 B2
(45) Date of Patent: Oct. 3, 2023

(54) SEMICONDUCTOR DEVICE

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 29 days.

(21) Appl. No.: 17/231,666

(22) Filed: Apr. 15, 2021

(65) Prior Publication Data
US 2022/0336447 A1 Oct. 20, 2022

(51) Int. Cl.
*H01L 27/07* (2006.01)
*H01L 29/739* (2006.01)

(52) U.S. Cl.
CPC ...... *H01L 27/0727* (2013.01); *H01L 29/7397* (2013.01)

(58) Field of Classification Search
CPC ............. H01L 29/7804; H01L 29/7805; H01L 29/7396; H01L 29/7397
See application file for complete search history.

(56) References Cited

U.S. PATENT DOCUMENTS

| 5,773,851 A | * | 6/1998 | Nakamura | ........ H01L 29/66348 257/E29.198 |
| 6,445,048 B1 | * | 9/2002 | Pfirsch | ................ H01L 29/7397 257/E21.384 |
| 11,075,291 B1 | * | 7/2021 | Dainese | .............. H01L 29/7397 |
| 2009/0001411 A1 | * | 1/2009 | Tokura | ................ H01L 27/0664 257/140 |
| 2014/0054644 A1 | * | 2/2014 | Hikasa | ................ H01L 29/0696 257/139 |
| 2018/0308839 A1 | | 10/2018 | Takahashi | |

FOREIGN PATENT DOCUMENTS

JP 2018-182254 A 11/2018

* cited by examiner

*Primary Examiner* — Jesse Y Miyoshi
(74) *Attorney, Agent, or Firm* — McDermott Will & Emery LLP

(57) ABSTRACT

A semiconductor device includes a semiconductor substrate having first and second surfaces, an insulated gate bipolar transistor (IGBT) and a diode formed on the semiconductor substrate, wherein the diode comprises a drift layer of a first conductivity type formed so as to have a first region on the first surface of the semiconductor substrate, a first body layer of a second conductivity type formed so as to have a second region adjacent to the first region at an upper portion of the drift layer, a first floating layer of the second conductivity type formed so as to have a third region adjacent to the first region at an upper portion of the drift layer, a first trench electrode formed in a region adjacent to the first floating layer at an upper portion of the drift layer, and a first control gate formed on top of the first region.

9 Claims, 21 Drawing Sheets

FIG. 2
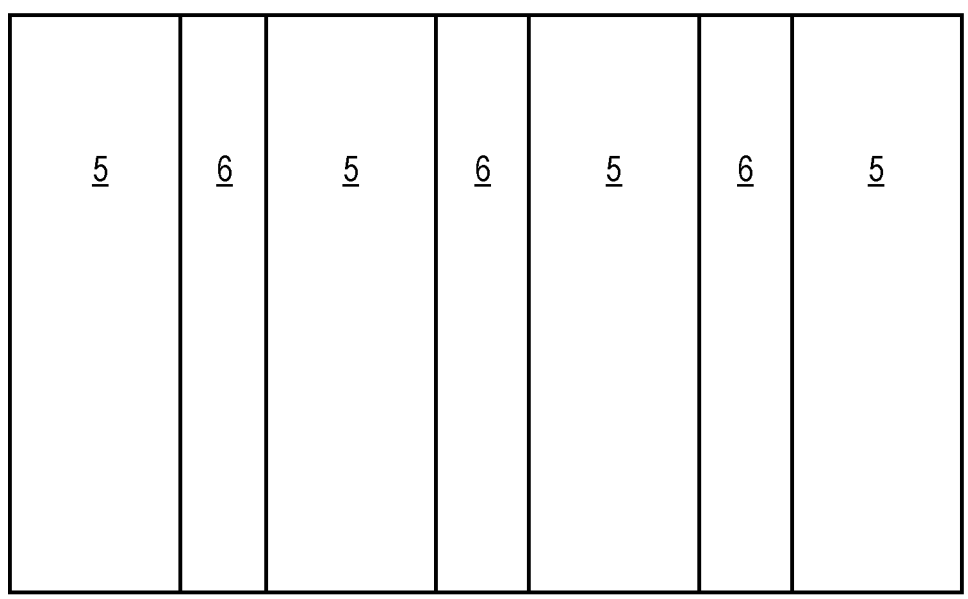
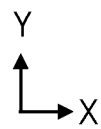

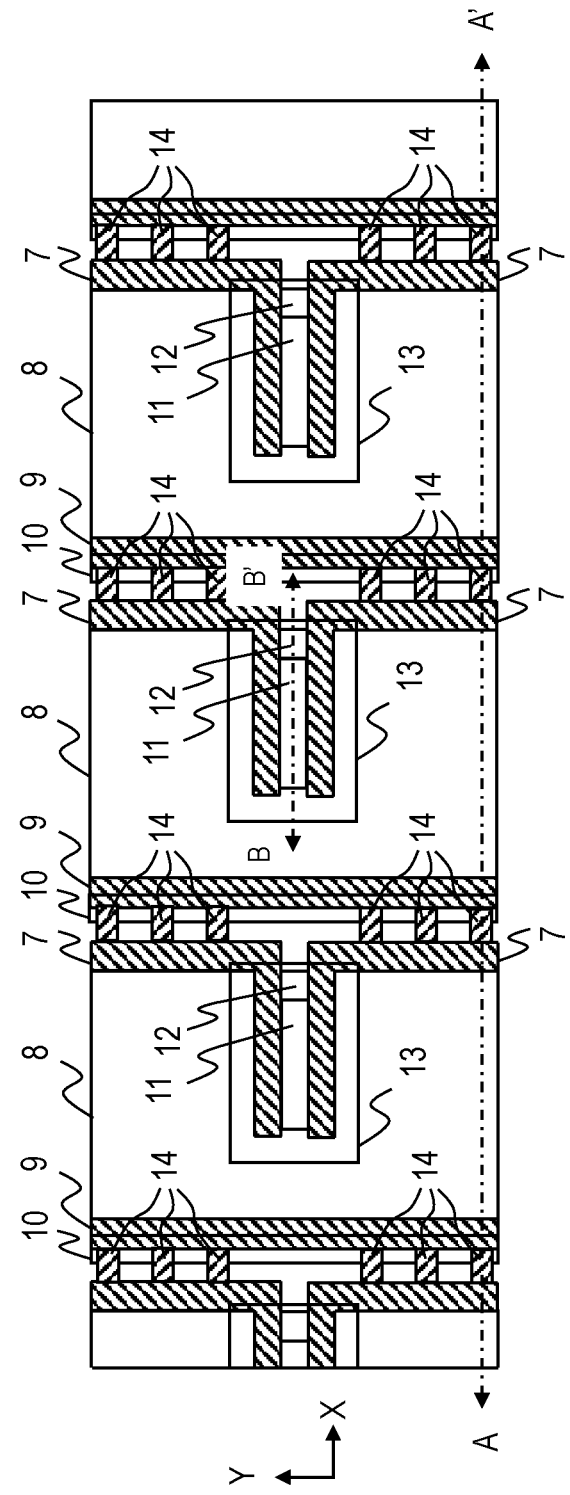

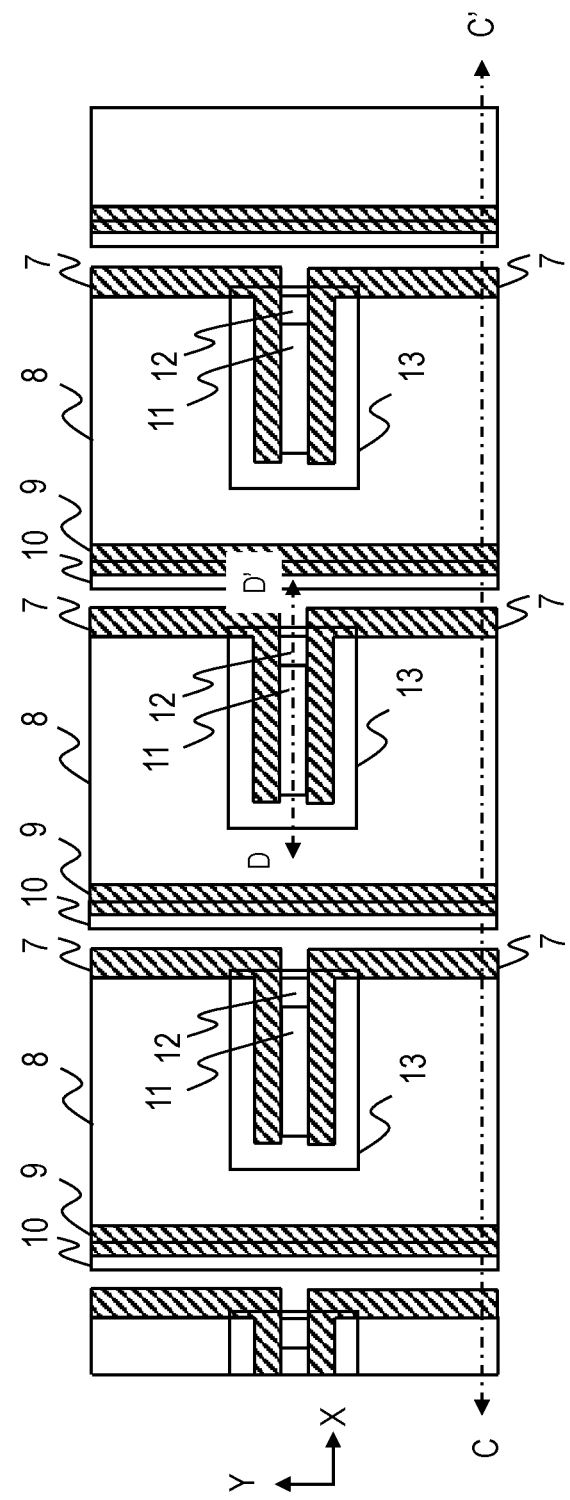

FIG. 7
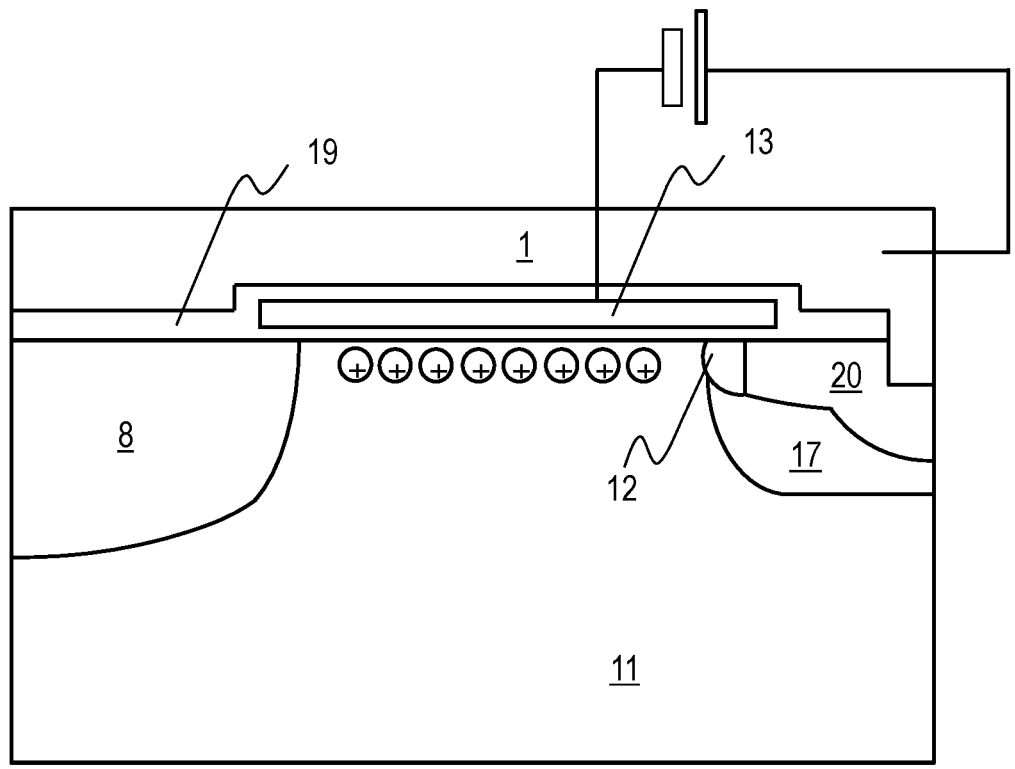
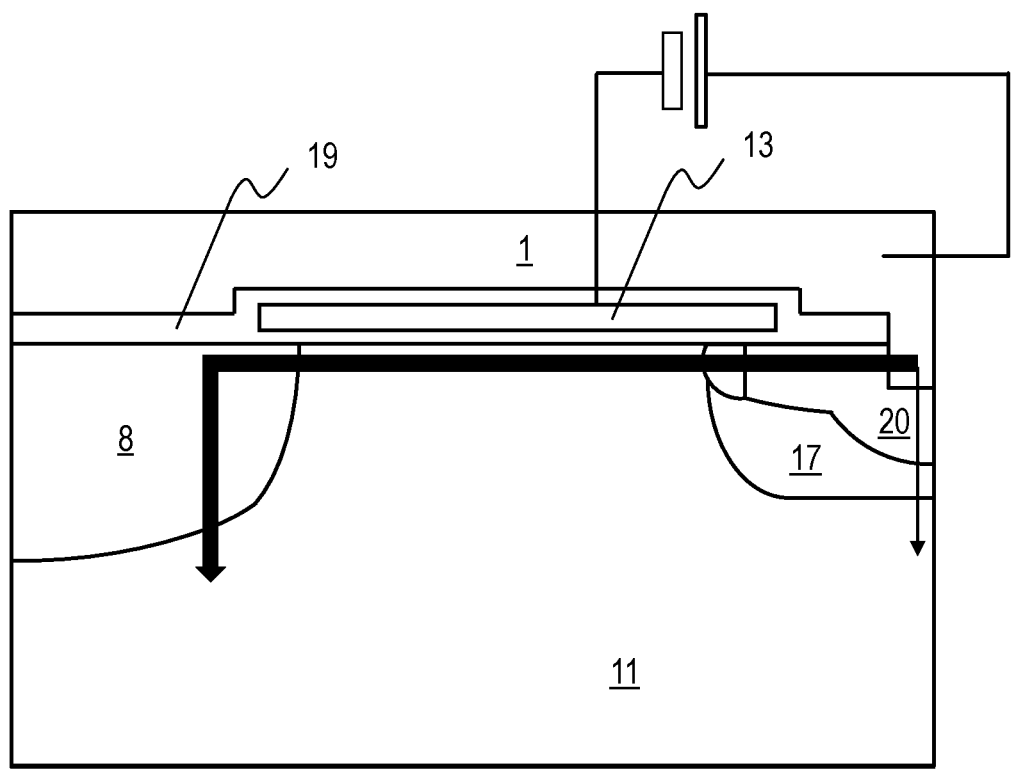

SEMICONDUCTOR DEVICE

BACKGROUND

The present application relates to a semiconductor device and its manufacturing method, and more particularly to a semiconductor device with an insulated-gate bipolar transistor (IGBT: Insulated Gate Bipolar Transistor).

Trench gate type IGBTs are widely used as IGBT with low on-resistance, i.e., low forward-saturation-voltage Vce (sat). In addition, an RC-IGBT (Reverse-Conducting IGBT in which a IGBT and an FWD (Free Wheeling Diode) are integrated into one chip has been developed.

Though there is a merit by the one chip formation in RC-IGBT, there is a problem that there is a limitation in the performance upgrading of FWD. Specifically, it is a recovery loss of the FWD and a deterioration of the VF (forward drop voltage). In order to reduce the recovery loss of the FWD, an introduction of a lifetime killer is considered. However, when lifetime killer is introduced, VF deteriorates. And, the performance of IGBT also deteriorates by the introduction of the lifetime killer. An improvement method other than the lifetime killer is necessary.

Patent Document 1 discloses a technique of suppressing the phenomena that the VF of the FWD increases by providing the second FWD, and suppressing the increase in switching losses.

Prior-Art Document

[Patent Document]
[Patent Document 1] Japanese Unexamined Publication Laid-Open No. 2018-182254

SUMMARY

In RC-IGBT, it is required to achieve both reduce of VF and reduction of recovery losses without requiring the lifetime killer.

Other objects and novel features will become apparent from the description of the specification and drawings.

A semiconductor device according to an embodiment includes a semiconductor substrate having first and second surfaces, an insulated gate bipolar transistor (IGBT) and a diode formed on the semiconductor substrate, wherein the diode comprises a drift layer of a first conductivity type formed so as to have a first region on the first surface of the semiconductor substrate, a first body layer of a second conductivity type formed so as to have a second region adjacent to the first region at an upper portion of the drift layer, a first floating layer of the second conductivity type formed so as to have a third region adjacent to the first region at an upper portion of the drift layer, a first trench electrode formed in a region adjacent to the first floating layer at an upper portion of the drift layer, and a first control gate formed on top of the first region.

In semiconductor device according to an embodiment, VF of FWD and recovery losses can be reduced.

BRIEF DESCRIPTION OF THE DRAWINGS

FIG. 2 is a plan view of the semiconductor chip according to first embodiment.

FIG. 3A shows a plan view of IGBT region of the semiconductor chip according to first embodiment.

FIG. 4A shows a plan view of a diode region of the semiconductor chip according to first embodiment.

FIG. 7 is a diagram for explaining the operation of the semiconductor chip according to first embodiment.

DETAILED DESCRIPTION

Figure 1:
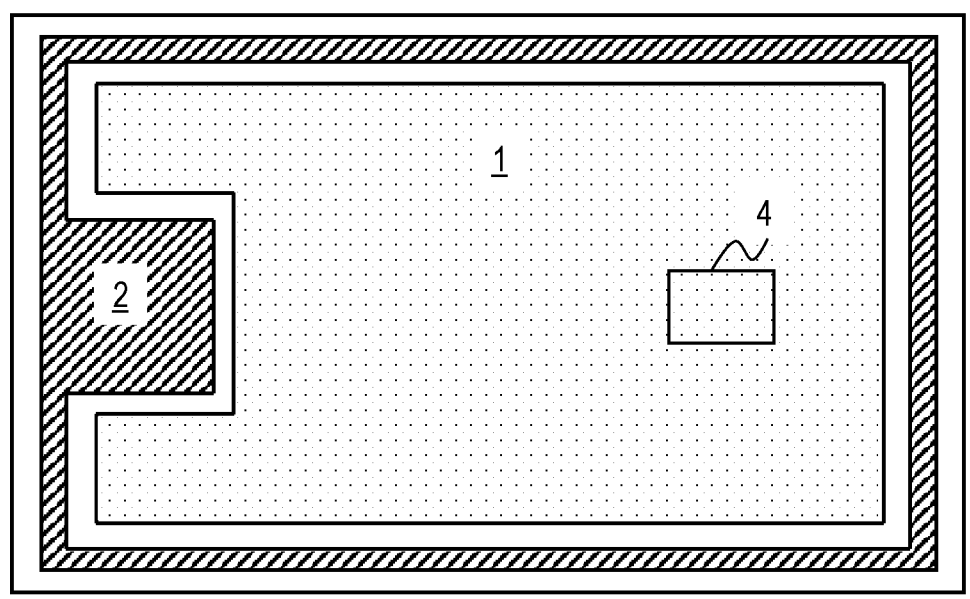
FIG. 1 is a plan view of a semiconductor chip according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a plan view of a semiconductor chip (RC-IGBT) 100 which is a semiconductor device according to the first embodiment. In FIG. 1, a state in which the insulating film is made transparent for simplicity of understanding. As shown in FIG. 1, most of the surface of the semiconductor chip 100 (first surface) is covered with an emitter electrode 1. In the outer periphery of the emitter electrode 1, a gate electrode 2 is formed. Further, in a back surface of the semiconductor chip 100 (second surface), a collector electrode (shared with the cathode electrode) 3 is formed. An emitter potential is supplied to the emitter electrode 1. A gate potential is supplied to the gate electrode 2.

FIG. 2 is an enlarged view of the region 4 of FIG. 1. The region 5 is a region in which IGBTs are formed. The region 6 is a region where diodes (FWDs) are formed.

Figure 3B:
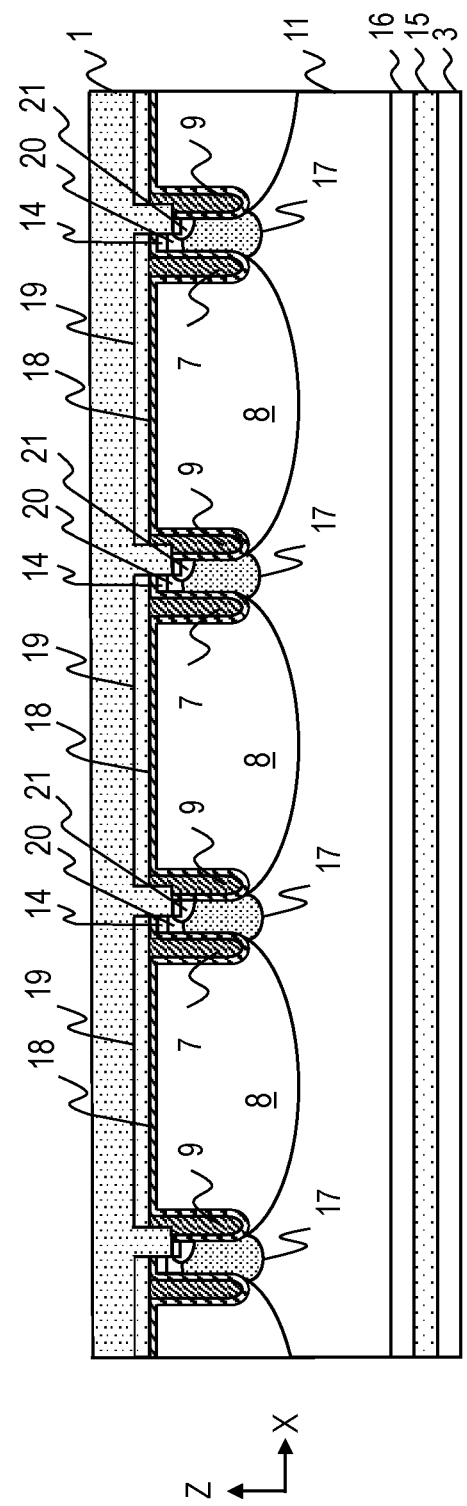
FIG. 3B shows a cross-sectional view of IGBT region of the semiconductor chip according to first embodiment.

FIG. 3A is an enlarged view of the IGBT region 5. FIG. 3B is a cross-sectional view along A-A' line of FIG. 3A. IGBT of the first embodiment is a GE-S type (GE type shrink structure) which is a type of IE type IGBT. As shown in FIGS. 3A and 3B, in the IGBT region, the emitter electrode 1, the collector electrode (cathode electrode) 3, a p+ type collector layer 15, an n+ type field stop layer 16, and an n− type drift layer 11 are formed on a semiconductor substrate. The IGBT region further includes a gate potential trench electrode (also referred to as a trench gate of the gate potential) 7 to which the gate potential is supplied, and an emitter potential trench electrode (also referred to as a trench gate of the emitter potential) 9 to which the emitter potential is supplied. Between the gate potential trench electrode 7 and the emitter potential trench electrode 9, n+ type hole barrier layer 17 is formed. The region formed by the gate potential trench electrode 7, the emitter potential trench electrode 9 and the hole barrier layer 17 is an active cell region. A p+ type floating layer 8 (non-active cell region) is formed between the two active cell regions.

Figure 10:
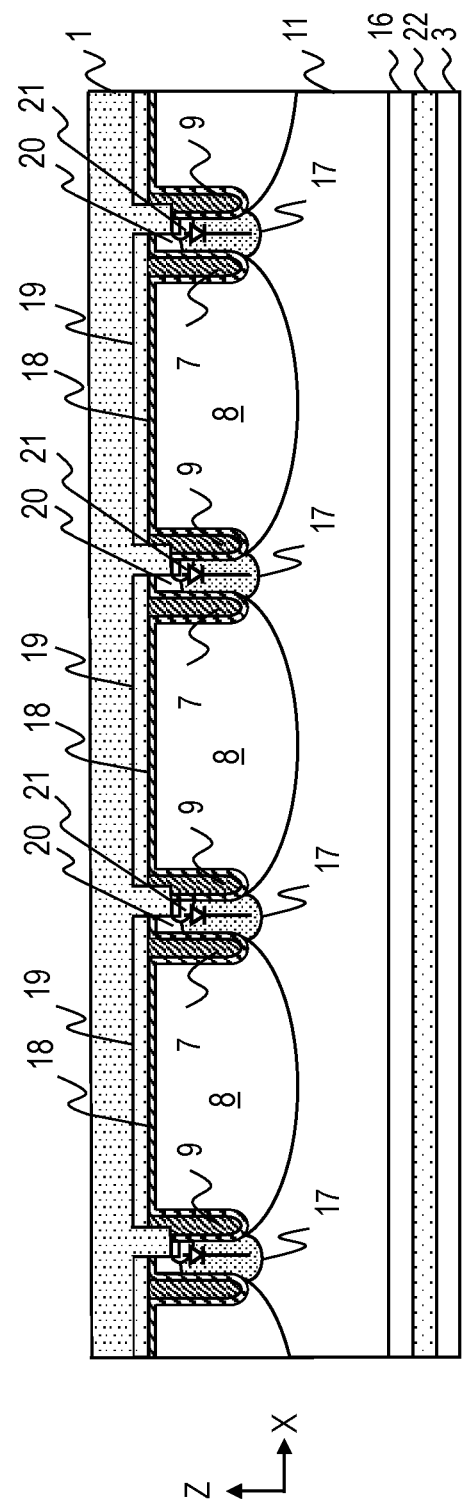
FIG. 10 is a cross-sectional view of the diode region of the semiconductor chip according to first embodiment.

The emitter potential trench electrode 9 is coupled to the emitter electrode 1 through a contact hole. The emitter electrode 1 is coupled to a p+ type latch-up prevention layer 21 through the contact hole and a body contact. Between the gate potential trench electrode 7 and the contact hole of the emitter electrode 1, n+ type emitter layer 14 and p+ type body layer 20 are formed. The emitter layer 14 and the body layer 20 are coupled to the emitter electrode 1 through the contact hole. In FIG. 3A, 10 is a body contact Si (Silicon) trench, 12 is a p+ type impurity layer, and 13 is a FC-GATE (Floating layer Control GATE. 18 in FIG. 3B is a gate insulating film, 19 is an interlayer insulating film.

As shown in FIG. 3A, the gate potential trench electrode 7 has a linear portion extending in the Y-axis direction (first direction), a shape having a bent portion extending in the X-axis direction (second direction). In simpler terms, it is L-shaped (first shape, or referred to as a first gate potential trench electrode). Furthermore, the gate potential trench 7 has a line-symmetrical shape with the first shape in a line parallel to the X-axis (second shape, or referred to as a second gate potential trench electrode). An n− type drift layer 11 and a p+ type impurity layer 12 are formed in a region sandwiched between the first and second shapes. A FC-GATE 13 is formed on the n− type drift layer 11 and the p+ type impurity layer 12 in a region sandwiched between the first and second shapes. FC-GATE 13 is Poly-Si (Polycrystalline Silicon) and is coupled to the gate electrode 2.

Figure 4B:
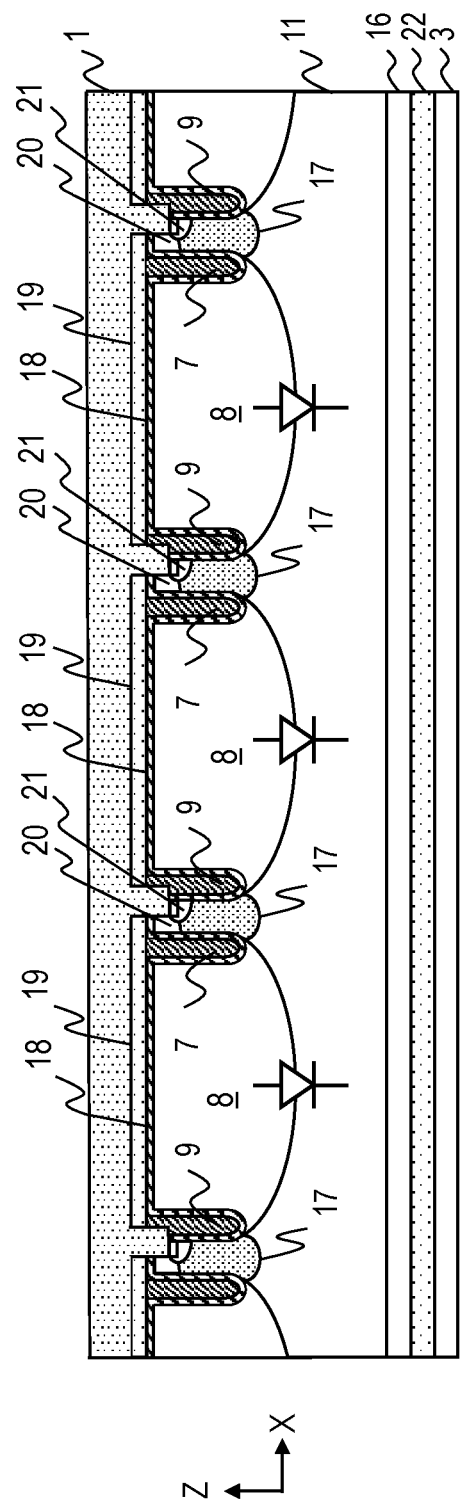
FIG. 4B shows a cross-sectional view of the diode region of the semiconductor chip according to first embodiment.

FIG. 4A is an enlarged view of the diode region 6. FIG. 4B is a cross-sectional view along C-C' line of FIG. 4A. As shown in FIGS. 4A and 4B, in the diode region, the emitter electrode 1, the cathode electrode (shared with the collector electrode) 3, the n+ type cathode layer 22, the n+ type field stop layer 16 and the n− type drift layer 11 are formed on semiconductor substrate. In the diode region similar to IGBT region, the gate potential trench electrode 7, the emitter potential trench electrode 9, the body contact Si trench 10, the p+ type floating layer 8, the n+ type hole barrier layer 17, the gate insulating film 18, the interlayer insulating film 19, the p+ type body layer 20, the p+ type latch-up preventing layer 21, FC-GATE 13 and the p+ type impurity layer 12 are further formed.

Next, the operation of the semiconductor chip 100 (RC-IGBT) according to the first embodiment will be described with reference to FIGS. 5 to 10.

Prior to explaining the operation of the diode (diode region) which is a characteristic of first embodiment, first, the operation of IGBT (IGBT region) will be described. When IGBT is turned off, a negative voltage (e.g. −15V) is applied to the gate. When the negative voltage is applied to the gate, the negative voltage is also applied to FC-GATE 13. The above figure in FIG. 7 is cross-sectional view along B-B' line in FIG. 3A. Incidentally, the above figure of FIG. 7 also serves as a cross-sectional view along D-D' line of FIG. 4A. As shown in FIG. 7, the n− type drifting region 11 is also formed in the region (fourth region) of the surface of semiconductor substrate. Since the impurity layer 12 and the body layer 20 are of the same p+ type, they are also referred to as a body layer together. The p+ type body layer is formed in a region (the fifth region) adjacent to the surface region (the fourth region) of the drifting layer 11 on the surface of semiconductor substrate. The p+ type floating layer 8 is formed in a region (the sixth region) adjacent to the surface region (the fourth region) of the drift layer 11 on the surface of semiconductor substrate.

When the negative voltage is applied to FC-GATE 13, a hole path is formed from the p+ type floating layer 8 to the p+ type body layer 20 by collecting holes on the surface of the n− type drift layer 11 as shown in the top view of FIG. 7. When the hole path is formed, the carrier (hole) of the floating layer 8 is discharged to the emitter electrode 1. Therefore, at the time of turn-off, the discharge of the carrier is promoted, thereby enabling high-speed turn-off.

On the other hand, when IGBT is turned on, a positive voltage (e.g., +15V) is applied to the gate. When the positive voltage is applied to the gate, the positive voltage is also applied to FC-GATE 13. If the positive voltage is applied to FC-GATE 13, the hole path described above is not formed. Therefore, the carrier discharge suppressing function of the floating layer 8 functions, and the IE effect can be obtained. The IE-effect improves switching losses when IGBT is turned on.

Next, the operation of the diode (diode region) which is a characteristic of first embodiment. As shown in FIG. 7, even in the diode region, the n− type drift layer 11 is also formed in the region (first region) of the surface of semiconductor substrate. The p+ type body layer is formed in a region (second region) adjacent to the surface region (first region) of the drift layer 11 on the surface of semiconductor substrate. The p+ type floating layer 8 is formed in a region (the third region) adjacent to the surface region (the first region) of the drift layer 11 on the surface of semiconductor substrate.

Figure 5:
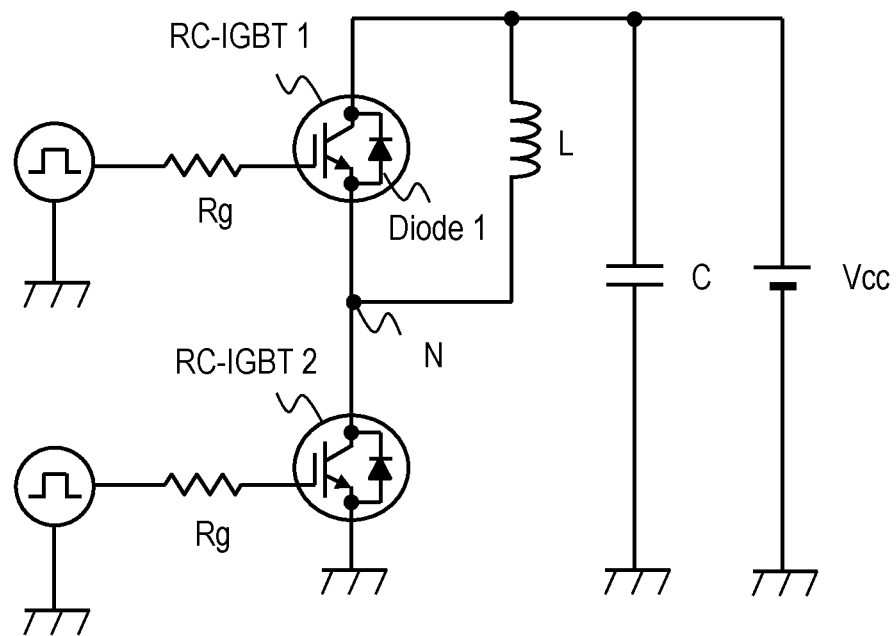
FIG. 5 is a circuit diagram for explaining the operation of the semiconductor chip according to first embodiment.

FIG. 5 is a circuit diagram for explaining the operation of RC-IGBT. As shown in FIG. 5, RC-IGBT 1 is disposed on the high side and RC-IGBT 2 is disposed on the low side. RC-IGBT 1 and RC-IGBT 2 have a structure of RC-IGBT described above.

Figure 6:
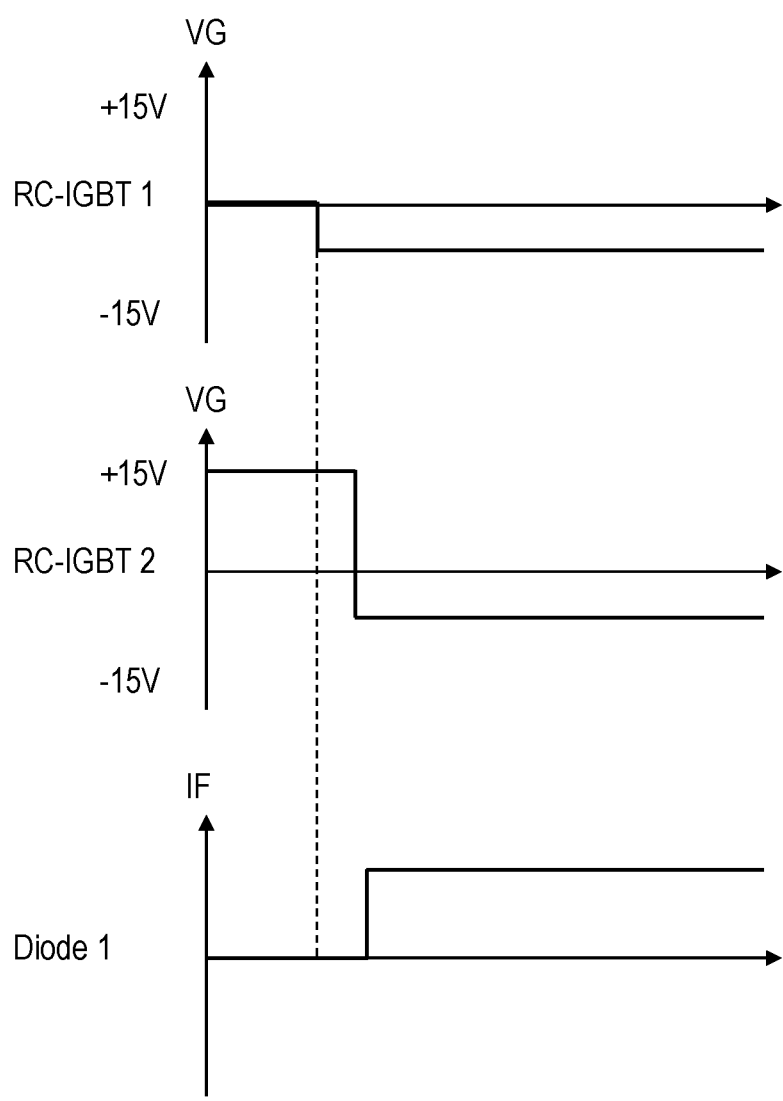
FIG. 6 is a timing chart for explaining the operation of the semiconductor chip according to first embodiment.
Figure 8:
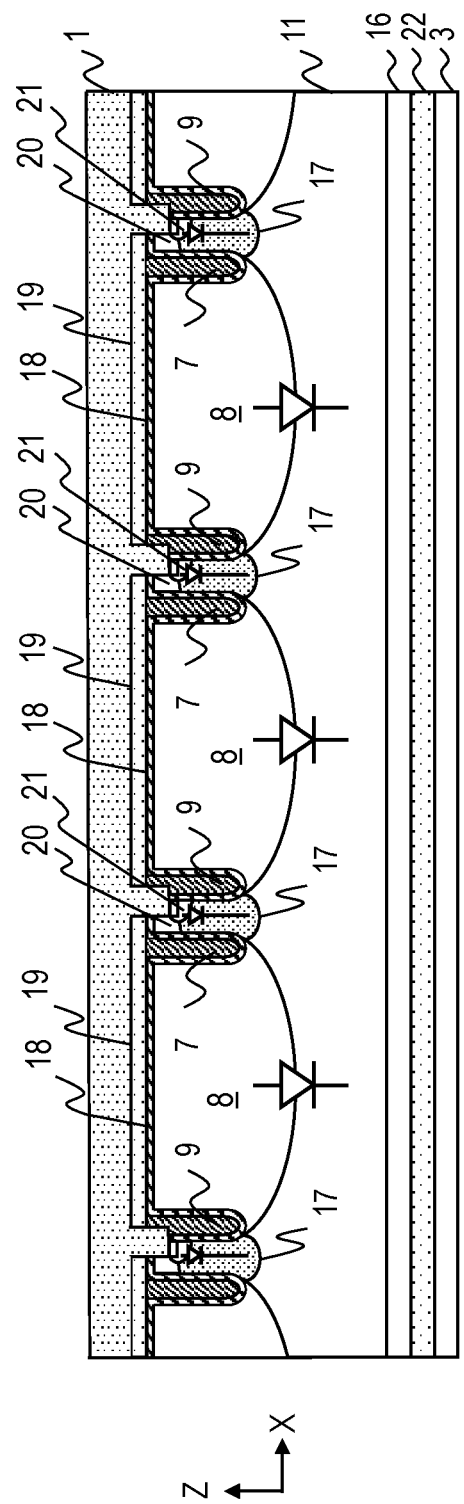
FIG. 8 is a cross-sectional view of the diode region of the semiconductor chip according to first embodiment.

First, RC-IGBT 2 will be described from the on state to the off state. FIG. 6 is a timing chart for explaining the operations of RC-IGBT 1 and RC-IGBT 2.

When RC-IGBT 2 is on, a positive voltage (+15V) is applied to the gate of RC-IGBT 2. At this time, RC-IGBT 1 is off-state, 0V is applied to the gate of RC-IGBT 1. A current flows to the coil L through RC-IGBT 2. RC-IGBT 2 is then turned off when a negative voltage is applied to the gate of RC-IGBT 2. When RC-IGBT 2 is turned off, a current flows from the coil L to Diode 1 that is the FWD of RC-IGBT 1. In first embodiment, just before RC-IGBT 2 is turned off, a negative voltage is applied to the gate of RC-IGBT 1. When the negative voltage is applied to the gate of RC-IGBT 1, the negative voltage is also applied to FC-GATE 13 of RC-IGBT 1. When the negative voltage is applied to FC-GATE 13, IGBT of RC-IGBT 1 turns off. The operation of Diode 1 is as follows when the negative voltage is applied to FC-GATE 13. As shown in upper part of FIG. 7, holes gather on the surface (first region) of the drift layer 11 in the diode region, p-type inversion layer is formed. When the p-type inversion layer is formed, the p+ type floating layer 8, the p+ type impurity layer 12 and the p+ type body layer 20 in the diode region are coupled, the floating layer 8 functions as an anode layer. Therefore, the p+ type floating layer 8 (anode layer) and the n− type drift layer (cathode layer) in the diode region function as a diode (FWD) (diode in FIG. 4B). By the entire floating layer 8 functions as an anode layer, the region of the diode is increased, leading to VF reduce when the current flows. The p+ type body layer 20 also functions as the anode, but the n+ type hole barrier layer 17 is formed below the body layer 20. Since the hole barrier layer is not formed under the floating layer 8, the carrier injection amount can be increased as compared with the body layer 20, which contributes to the VF reduce. Therefore, more current flows towards the diode formed by the floating layer 8 (lower part in FIG. 7 and FIG. 8).

Figure 9:
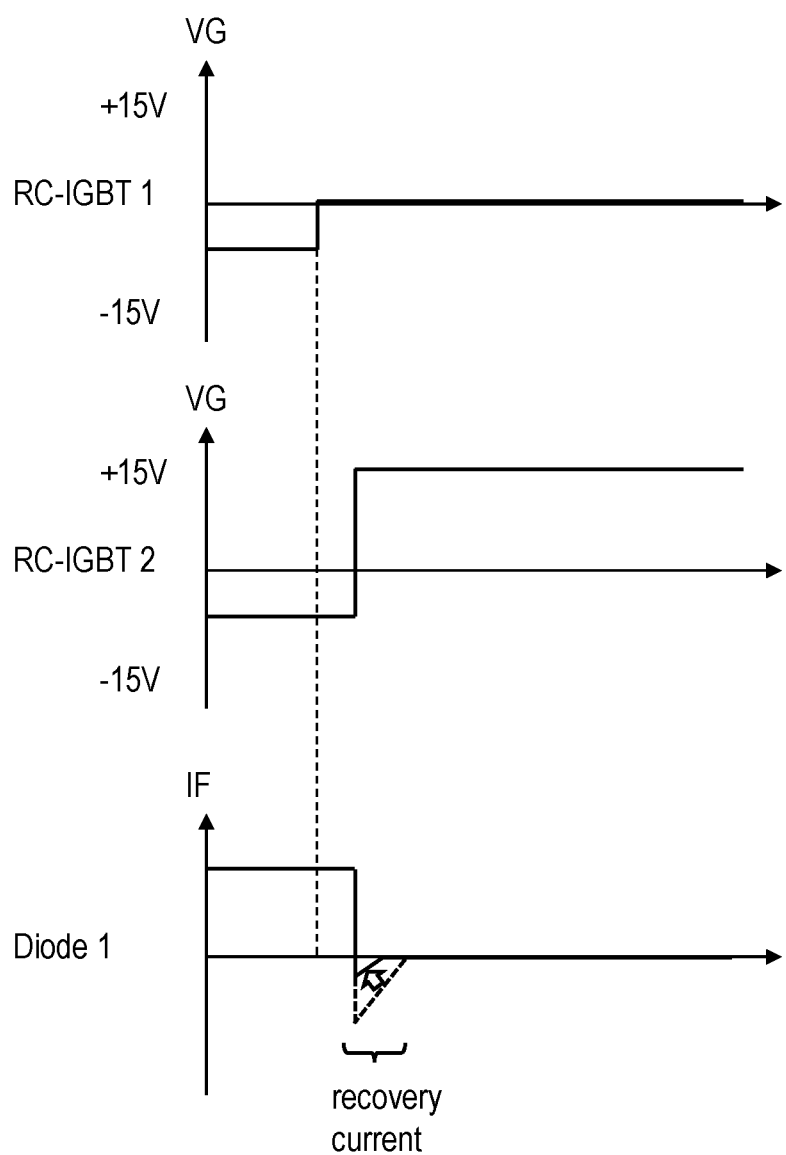
FIG. 9 is a timing chart for explaining the operation of the semiconductor chip according to first embodiment.

Next, a case where RC-IGBT 2 is turned from the off state to the on state will be described. FIG. 9 is a timing chart for explaining the operations of RC-IGBT 1 and RC-IGBT 2. When the gate voltage of RC-IGBT 2 is changed from negative voltage to positive voltage, RC-IGBT 2 is switched from off-state to on-state. When RC-IGBT 2 is turned on, a current flows to the coil L through RC-IGBT 2. In addition, no current flows through Diode 1. In this first embodiment, the gate voltage of RC-IGBT 1 is set to 0V from the negative voltage prior to RC-IGBT 2 being turned on. When the gate-voltage of RC-IGBT 1 becomes 0V, FC-GATE 13 of RC-IGBT 1 also becomes 0V. When FC-GATE 13 becomes 0V, the inversion layer formed on the surface of the drift layer 11 in the diode-region disappears. The floating layer 8 in the diode region no longer serves as an anode layer, and the body layer 20 in the diode region serves as an anode layer (FIG. 10). Therefore, the amount of carrier accumulation due to the floating layer 8 is reduced, it is possible to reduce the recovery loss of the diode.

As described above, in the semiconductor chip (RC-IGBT) 100 according to first embodiment, the FC-GATE 13 is provided in the diode region, it is possible to control whether to function floating layer 8 as an anode layer. Therefore, the VF of the FWD and the recovery loss can be reduced.

Second Embodiment

The configuration of RC-IGBT according to the second embodiment is the same as that of first embodiment. RC-IGBT control methods differ.

Figure 11:
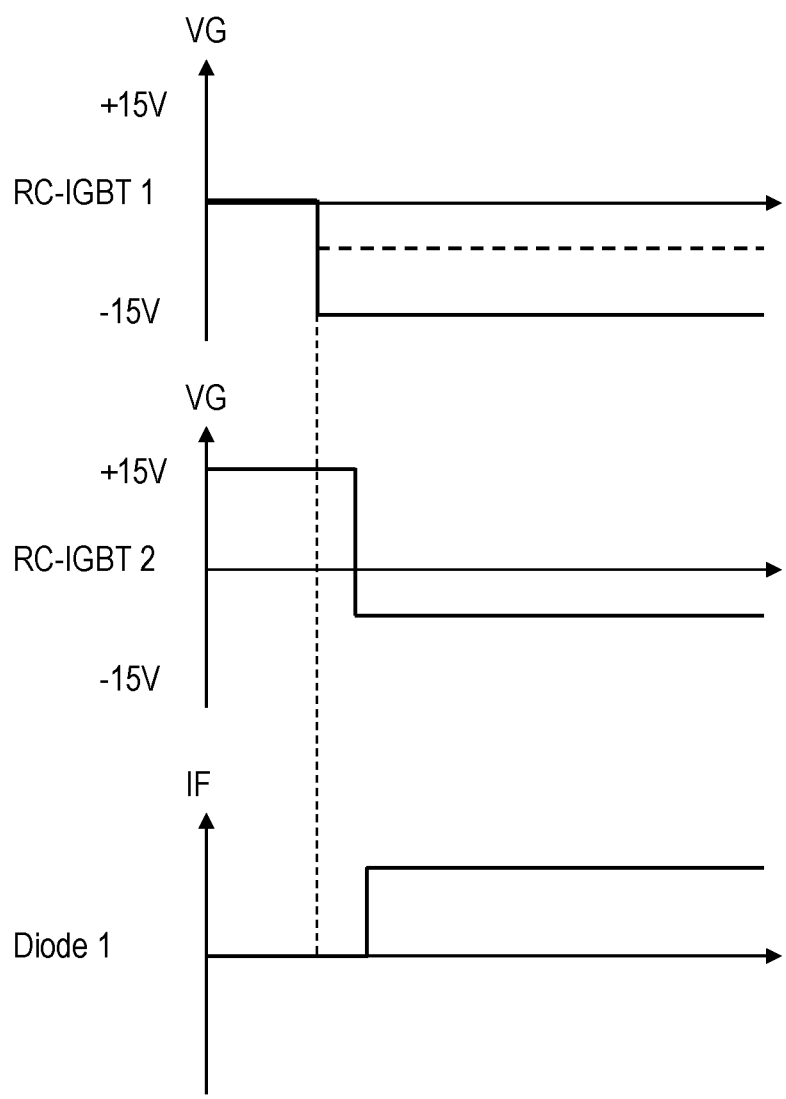
FIG. 11 is a timing chart for explaining the operation of the semiconductor chip according to second embodiment.

The operation of RC-IGBT according to second embodiment will be described with reference to FIGS. 11 and 12. FIG. 11 shows RC-IGBT 2 from the on state to the off state. The difference from first embodiment is a voltage applied to FC-GATE 13 of RC-IGBT 1 just before RC-IGBT 2 turns off. A negative voltage applied to FC-GATE 13 is higher (e.g. −15V) than first embodiment. Thus, the surface of the drift layer 11 in the diode region surrounded by FC-GATE 13 is strongly inverted. The connection between the floating layer 8 and the body layer 20 in the diode region becomes stronger, and the VF can be further reduced than the first embodiment.

Figure 12:
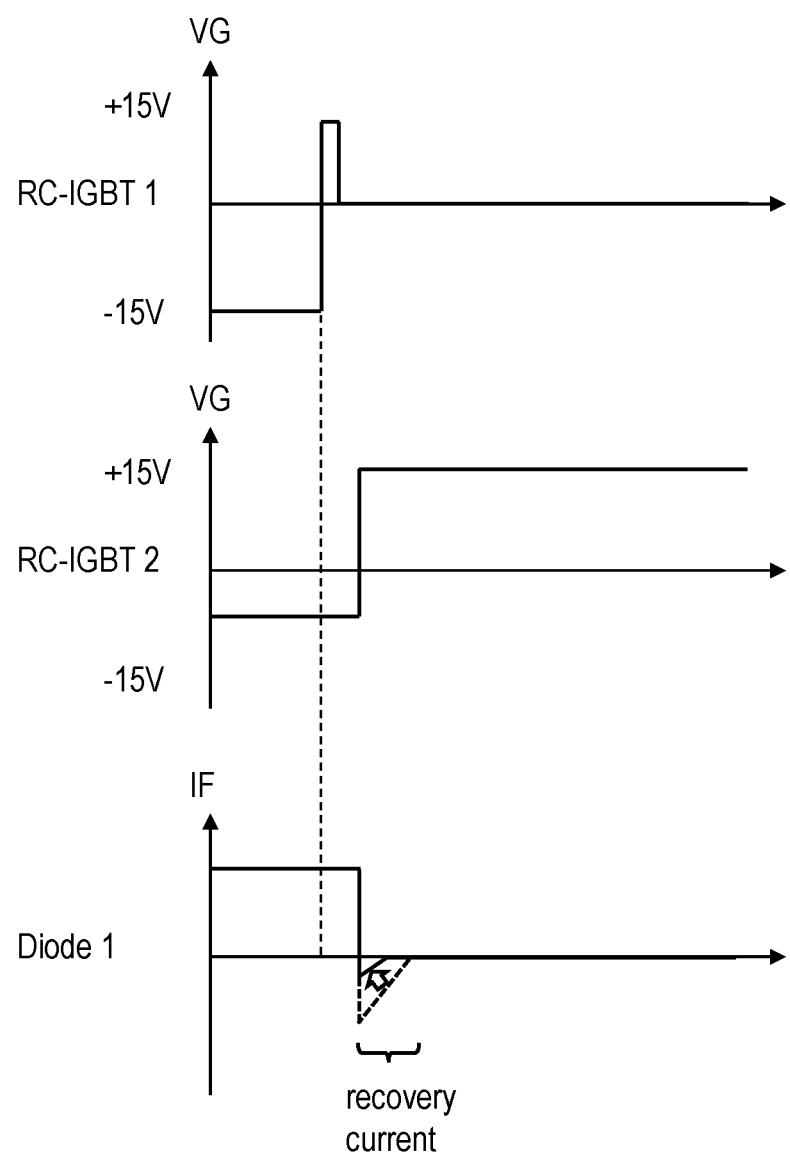
FIG. 12 is a timing chart for explaining the operation of the semiconductor chip according to second embodiment.

FIG. 12 shows RC-IGBT 2 from the off state to the on state. The difference from first embodiment is that a positive-voltage pulse is applied to FC-GATE 13 of RC-IGBT 1 just before RC-IGBT 2 is switched on. This improves the connection-shut-off capability between the floating layer 8 and the body layer 20 in the diode-region, further enables a reduction in recovery loss than first embodiment.

As described above, in the semiconductor chip (RC-IGBT) according to the second embodiment, it is possible to further reduce the VF and recovery loss of FWD than first embodiment.

Third Embodiment

In the first and second embodiments, FC-GATE 13 is coupled to the gate electrode, but in this third embodiment, FC-GATE 13 is coupled to an electrode independent of the gate electrode.

Figure 13:
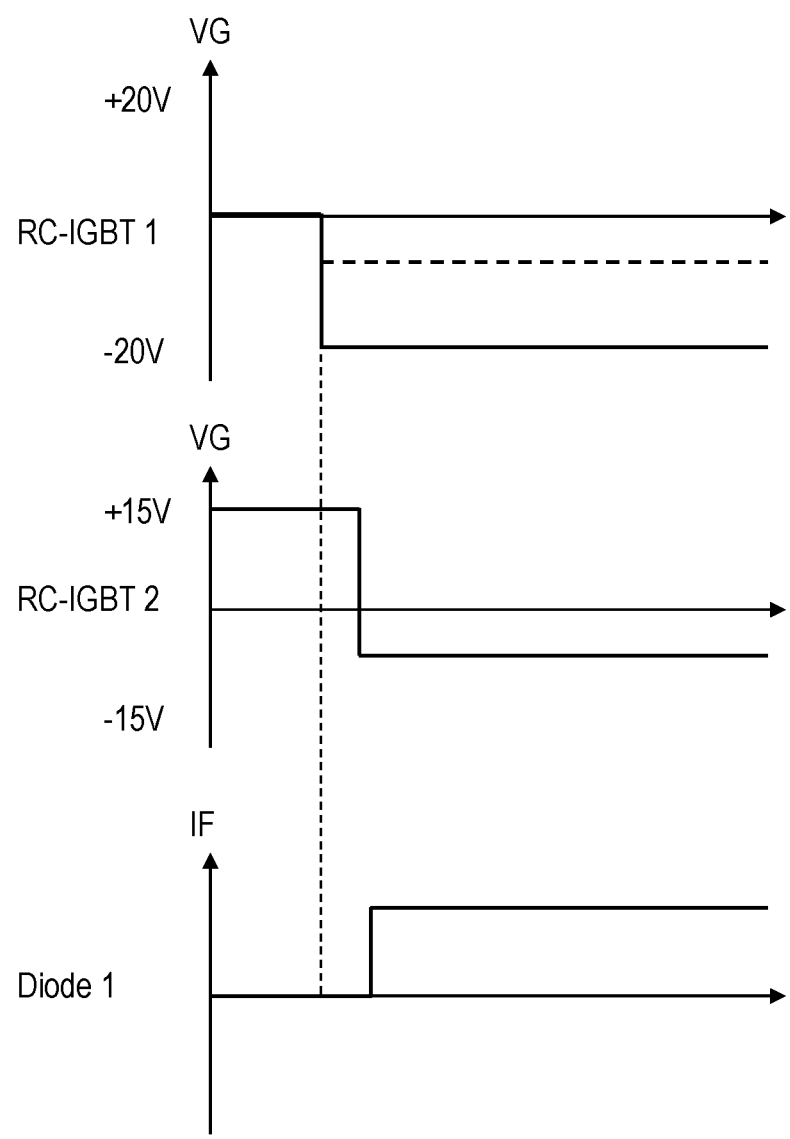
FIG. 13 is a timing chart for explaining the operation of the semiconductor chip according to third embodiment.

The operation of RC-IGBT according to third embodiment will be described with reference to FIGS. 13 and 14. FIG. 13 shows RC-IGBT 2 from the on state to the off state. The difference from first and second embodiments is a voltage applied to FC-GATE 13 of RC-IGBT 1. A negative voltage applied to FC-GATE 13 is higher (e.g. −20V) than second embodiment. As a result, the connection between the floating layer 8 and the body layer 20 in the diode region becomes stronger, and the VF can be further reduced than the second embodiment.

Figure 14:
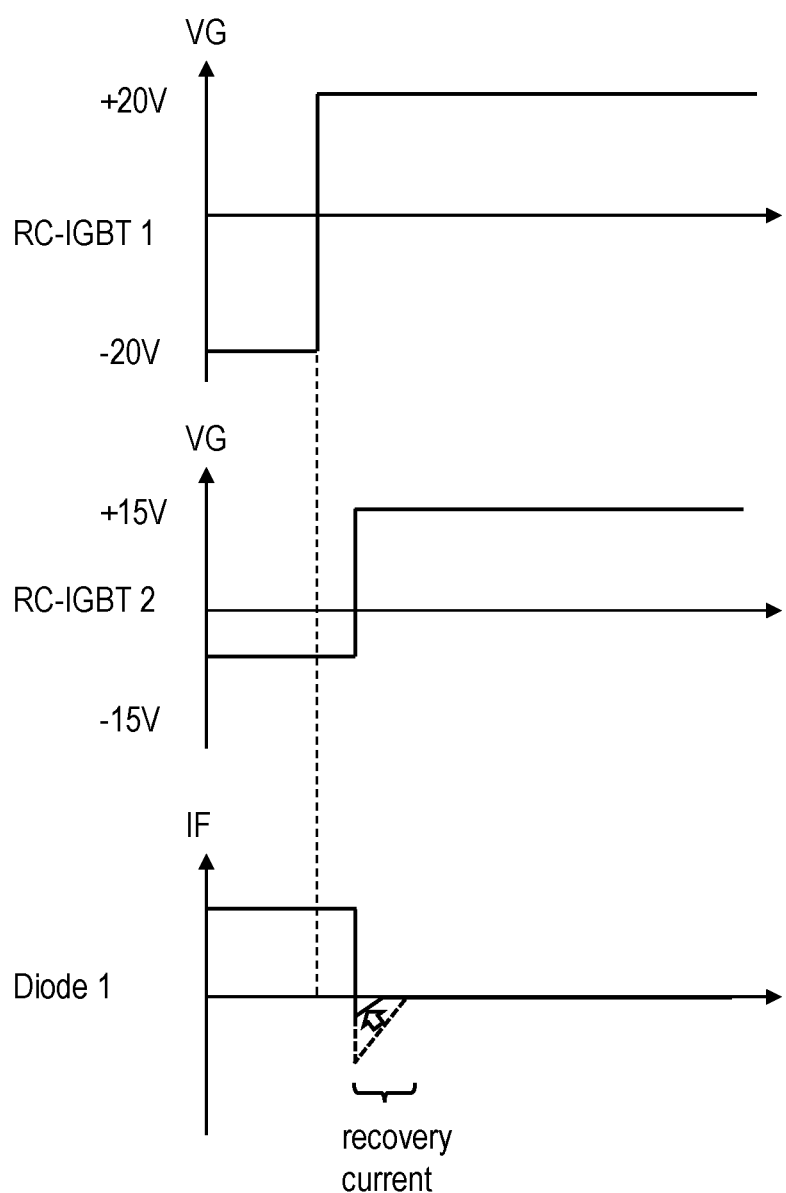
FIG. 14 is a timing chart for explaining the operation of the semiconductor chip according to third embodiment.

FIG. 14 shows RC-IGBT 2 from the off state to the on state. The difference from first and second embodiments is a voltage applied to FC-GATE 13 of RC-IGBT 1 just before RC-IGBT 2 is turned on. A voltage applied to FC-GATE 13 is higher (e.g., +20 V) than the first and second embodiments. Thus, the connection-shut-off capability between the floating layer 8 and the body layer 20 in the diode region is further improved, the recovery loss can be further reduced than the first and second embodiments. Incidentally, since FC-GATE 13 is independent of the gate electrode, even when applying +20V to FC-GATE 13, RC-IGBT 1 is never turned on.

The voltage applied to FC-GATE 13 depends on the guaranteed voltage on the gate-structure. If the guaranteed voltage is high (e.g. +30V), further VF reduction and recovery loss reduction are possible.

As described above, in the semiconductor chip (RC-IGBT) according to third embodiment, FC-GATE 13 is controllable independently of the gate electrode. Therefore, VF and recovery loss of FWD can be further reduced than first and second embodiments.

Fourth Embodiment

Figure 15:
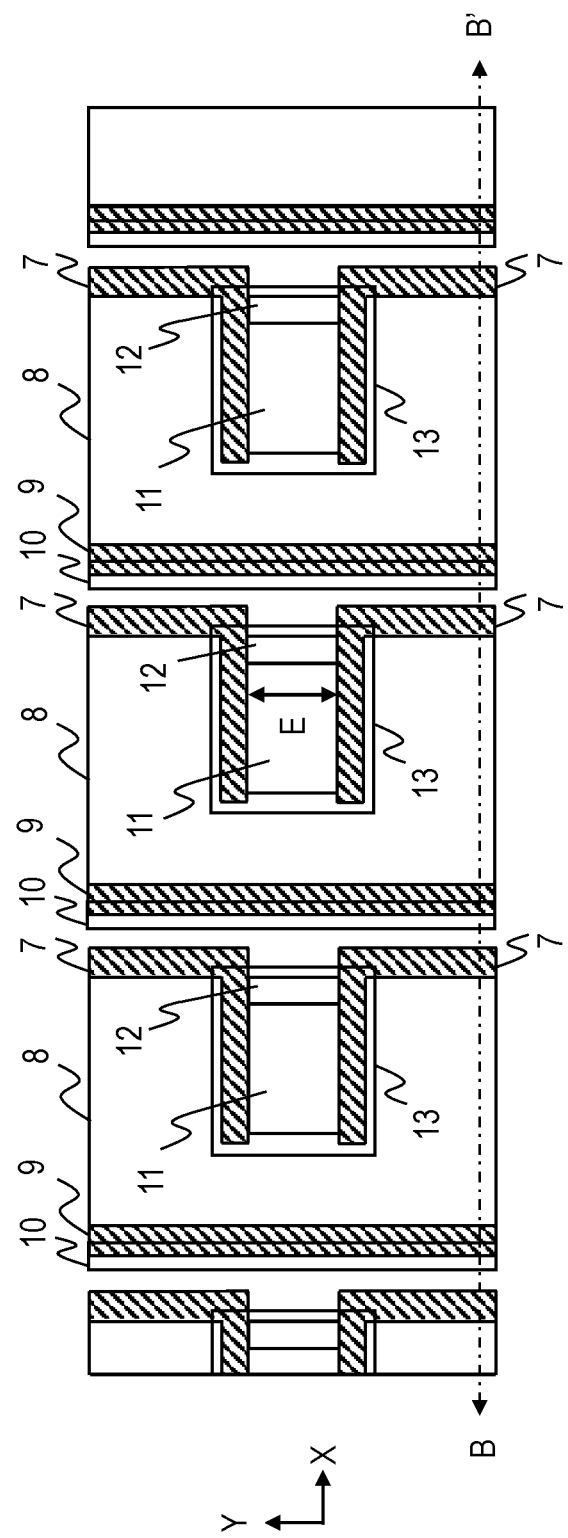
FIG. 15 is a plan view of the diode region of the semiconductor chip according to fourth embodiment.

FIG. 15 is an enlarged view of the diode region 6 of the semiconductor chip according to the fourth embodiment. The differences from first embodiment are FC-GATE 13 and the gate potential trench electrode 7. Compared to first embodiment, the interval E between the first and second shapes of the gate potential trench electrode 7 is widened. By widening the interval E, the carrier conduction amount when the floating layer 8 in the diode region operates as an anode layer is increased, VF of the FWD is reduced.

As described above, the semiconductor chip (RC-IGBT) according to fourth embodiment, the VF of FWD can be further reduced than first embodiment.

Fifth Embodiment

Figure 16:
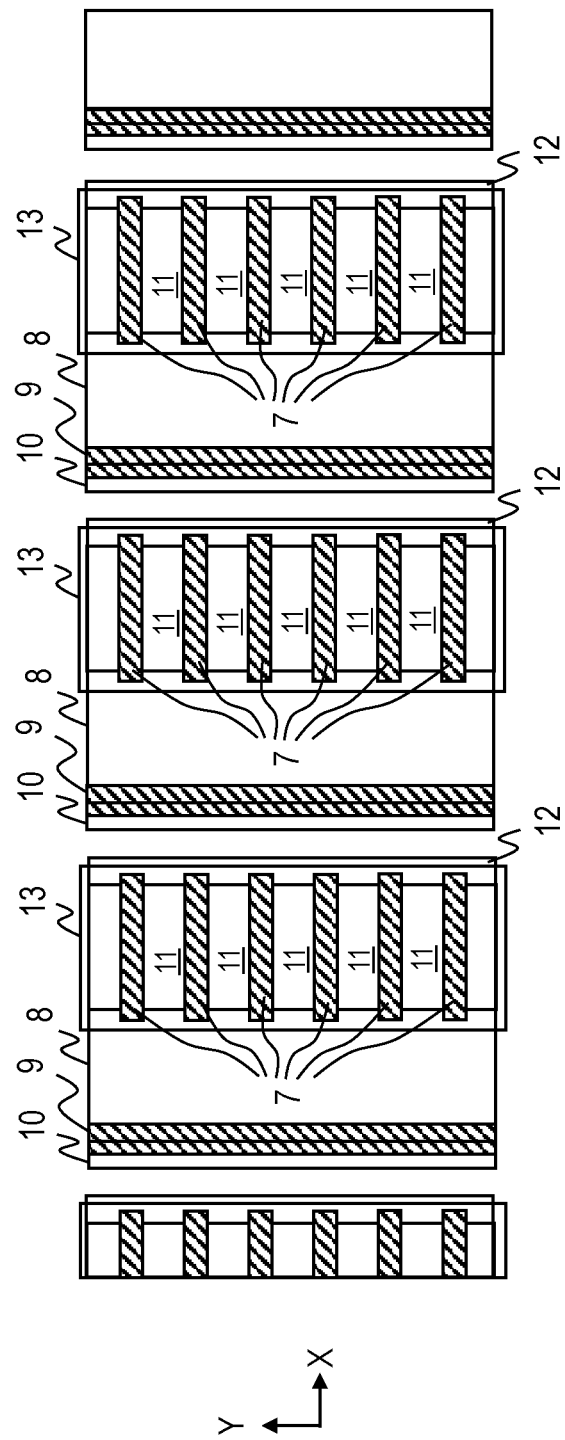
FIG. 16 is a plan view of the diode region of the semiconductor chip according to fifth embodiment.

FIG. 16 is an enlarged view of the diode area 6 of the semiconductor chip according to the fifth embodiment. As shown in FIG. 16, a plurality of gate potential trench electrodes 7 are formed so as to extend in the X-axis direction. FC-GATE 13 is formed on the plurality of gate potential trench electrodes 7 and on top of the drift layer 11 between the gate potential trench electrodes 7.

The operation of the semiconductor chip according to the fifth embodiment is similar to first to fourth embodiments except that a plurality of hole paths is generated between the gate potential trench electrodes 7.

In fifth embodiment, a gate capacitance of FC-GATE 13 in the IGBT region differs from a gate capacitance of FC-GATE 13 in the diode region. The difference between gate capacitances may cause that switching timings of the IGBT and the diode are different from expected timings. As a measure against this, it is desirable that FC-GATE 13 is controllable independently of the gate electrode (third embodiment).

As described above, in the semiconductor chip (RC-IGBT) according to the fifth embodiment, similarly to first embodiment, the VF of FWD and the recovery loss can be reduced.

Sixth Embodiment

Figure 17:
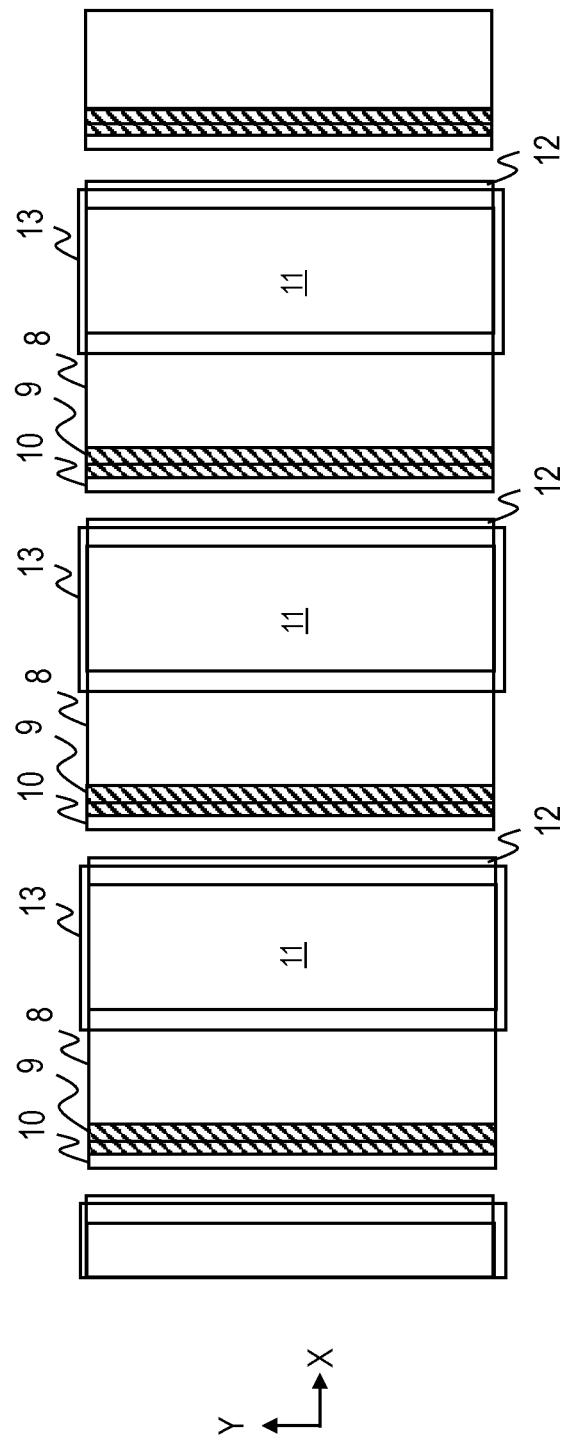
FIG. 17 is a plan view of the diode region of the semiconductor chip according to sixth embodiment.

FIG. 17 is an enlarged view of the diode region 6 of the semiconductor chip according to sixth embodiment. As shown in FIG. 17, in sixth embodiment, no gate potential trench electrode 7 is formed in the diode region. FC-GATE 13 is formed on the drift layer 11 between the floating layer 8 and the p+ type impurity layer 12. The structure is similar to that of first embodiment except that the gate potential trench electrode is not formed in the diode region.

The operation of the semiconductor chip according to sixth embodiment is similar to first to fifth embodiments except that the hole path is formed on the entire surface of the drift layer 11 in the diode region surrounded by FC-GATE 13.

As described above, in the semiconductor chip (RC-IGBT) according to sixth embodiment, similarly to first embodiment, the VF of FWD and the recovery loss can be reduced.

Seventh Embodiment

Figure 18:
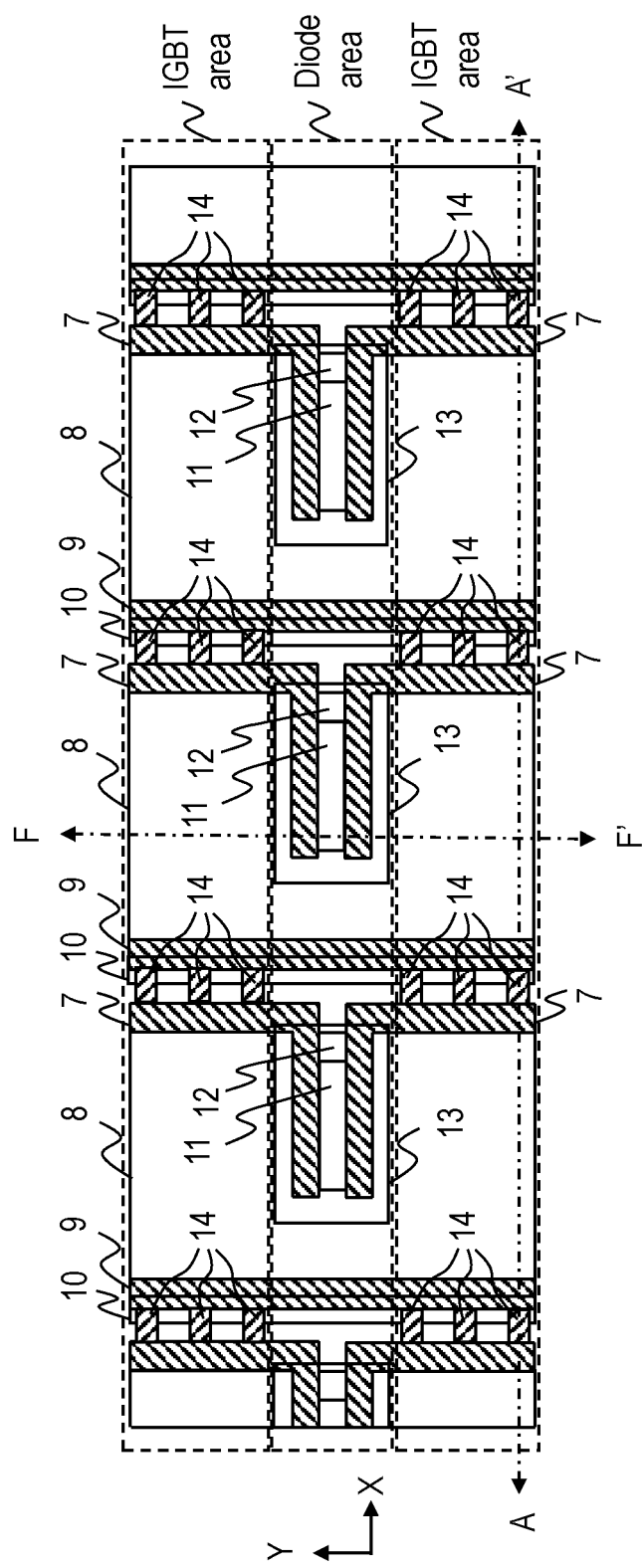
FIG. 18 is a plan view of the semiconductor chip according to seventh embodiment.
Figure 19:
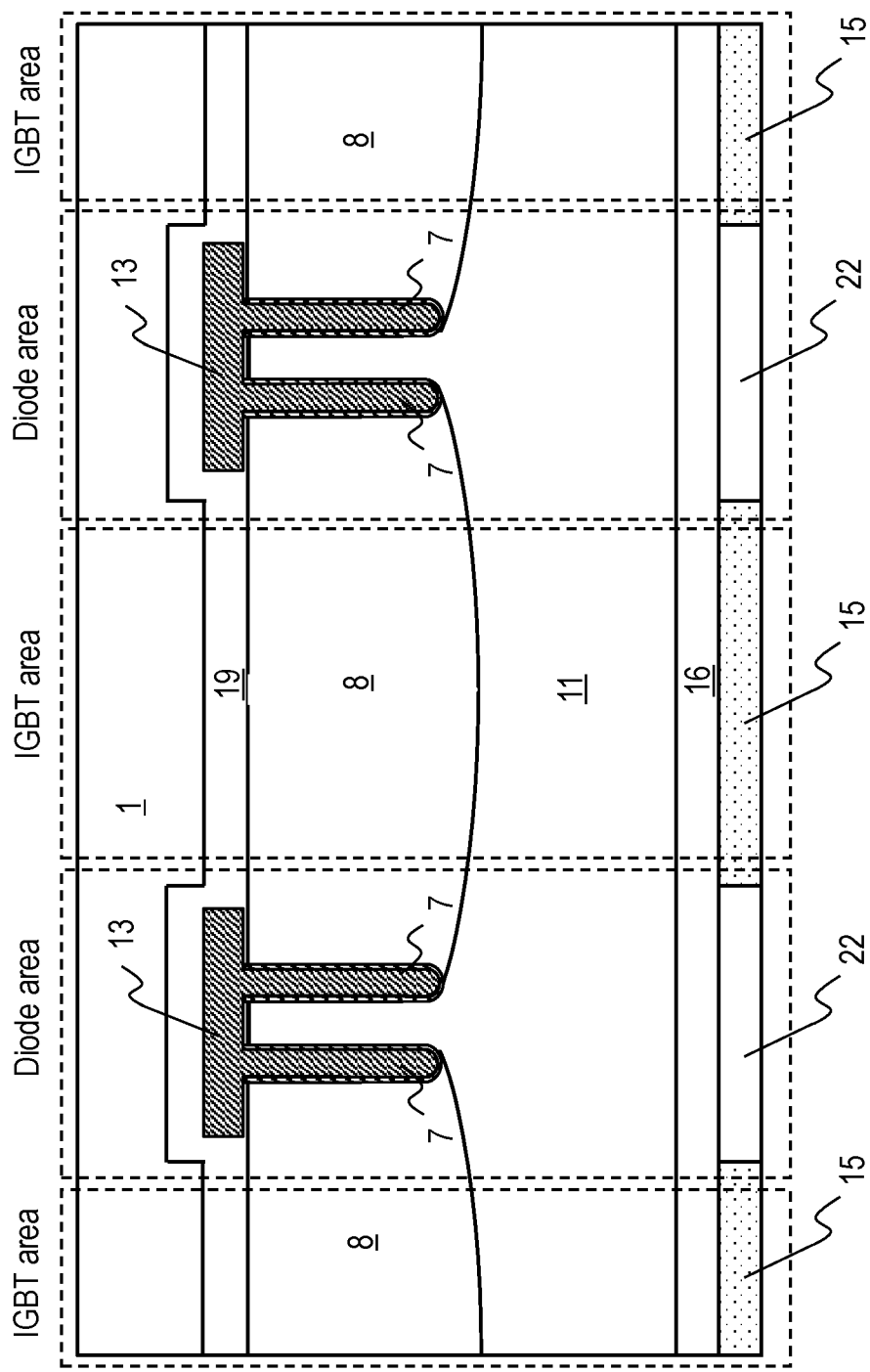
FIG. 19 is a cross-sectional view of the semiconductor chip according to seventh embodiment.

In first to sixth embodiments, the IGBT and diode regions are separated in the X-axis direction of the semiconductor chip. In seventh embodiment, in the Y-axis direction of the semiconductor chip, the IGBT region and the diode region are separated. FIG. 18 is an enlarged view of the surface of the semiconductor chip according to seventh embodiment. FIG. 19 is a cross-sectional view along F-F' line of FIG. 18. As shown in FIGS. 18 and 19, in the Y-axis direction of the semiconductor chip, the IGBT regions and the diode regions are alternately formed.

The IGBT region is formed at the straight portion of the gate potential trench electrode 7 in the Y-axis direction as shown in FIG. 18. No FC-GATE 13 is formed in the IGBT regions. The elements forming the IGBT are the same as those of first embodiment, and therefore detailed descriptions thereof are omitted.

The diode region is formed at the bent portion of the gate potential trench electrode 7 in the X-axis direction as shown in FIG. 18. FC-GATE 13 similar to first embodiment is formed in the diode region. The elements forming the diodes are the same as those of first embodiment, and therefore detailed descriptions thereof are omitted.

Next, the operation of RC-IGBT according to seventh embodiment will be described. In seventh embodiment, no FC-GATE 13 is formed in the IGBT region. Therefore, the IGBT region of seventh embodiment operates in the same manner as in a conventional IGBT.

FC-GATE 13 similar to first embodiment is formed in the diode region in seventh embodiment. Therefore, the diode region operates in the same way as first embodiment.

As described above, in the semiconductor chip (RC-IGBT) according to seventh embodiment, similarly to first embodiment, the VF of FWD and the recovery loss can be reduced.

It should be noted that the present invention is not limited to the above-mentioned embodiments, and various modifications can be made without departing from the gist thereof. For example, although GE-S type is used as IGBT for first embodiment, the present invention is not limited thereto. A GGEE type, an EGE type, or the like can also be used. Further, for example, although the gate potential trench electrode 7 is L-shaped, it may have a P-shaped loop shape.

What is claimed is:
1. A semiconductor device comprising:
   a semiconductor substrate having a first surface and a second surface; and
   an insulated gate bipolar transistor (IGBT) and a diode formed on the semiconductor substrate,
   wherein the diode comprising:
      a drift layer of a first conductivity type formed so as to have a first region on the first surface of the semiconductor substrate;
      a first body layer of a second conductivity type formed so as to have a second region adjacent to the first region at an upper portion of the drift layer of the first conductivity type;
      a first floating layer of the second conductivity type formed so as to have a third region adjacent to the first region at an upper portion of the drift layer of the first conductivity type;
      a first trench electrode formed in a region adjacent to the first floating layer at an upper portion of the drift layer of the first conductivity type; and
      a first control gate formed on top of the first region, and
   wherein the IGBT comprising:
      second and third trench electrodes formed on the first surface at an upper portion of the drift layer of the first conductivity type;
      a hole barrier layer of the first conductivity type formed between the second and third trench electrodes at an upper portion of the drift layer of the first conductivity type;
      a second body layer of the second conductivity type formed on the hole barrier layer of the first conductivity type; and
      an emitter layer of the first conductivity type formed on the first surface at an upper portion of the second body layer of the second conductivity type.
2. The semiconductor device according to claim 1, further comprising:
   a first electrode formed on the first surface; and
   a second electrode formed on the second surface,
   wherein the first and second body layers of the second conductivity type and the emitter layer of the first conductivity type are electrically coupled to the first electrode.
3. The semiconductor device according to claim 2, wherein the diode further comprises a fourth trench electrode formed so as to sandwich the first region.

4. The semiconductor device according to claim 2,
wherein the first, second and third trench electrodes extends in a first direction in a plan view, and
wherein the diode and IGBT are formed so as to be neighboring each other in a second direction in a plan view.

5. The semiconductor device according to claim 2,
wherein the IGBT further comprises a second floating layer of the second conductivity type and a second control gate,
wherein the drift layer of the first conductivity type is formed so as to have a fourth region on the first surface,
wherein the second body layer of the second conductivity type is formed so as to have a fifth region adjacent to the fourth region,
wherein the second floating layer of the second conductivity type is formed so as to have a sixth region adjacent to the fourth region, and
wherein the second control gate is formed on top of the fourth region.

6. The semiconductor device according to claim 5, wherein the second trench electrode has a portion sandwiching the fourth region.

7. The semiconductor device according to claim 6, further comprising:
a third electrode formed on the first surface,
wherein the second and fourth trench electrodes and the first and second control gates are electrically coupled to the third electrode.

8. The semiconductor device according to claim 2, wherein when a negative voltage is applied to the first control gate, the first floating layer of the second conductivity type operates as an anode.

9. The semiconductor device according to claim 8, wherein when a positive voltage is applied to the first control gate, the first floating layer of the second conductivity type does not function as the anode.

* * * * *